(12) United States Patent
Cheng et al.

(10) Patent No.: US 8,658,443 B2
(45) Date of Patent: Feb. 25, 2014

(54) METHOD FOR MANUFACTURING LIGHT EMITTING DEVICE

(75) Inventors: Wei-Kang Cheng, Taoyuan (TW);
Yu-Chih Lin, Taoyuan (TW);
Han-Zhong Liao, Taoyuan (TW);
Yi-Sheng Ting, Taoyuan (TW);
Shyi-Ming Pan, Taoyuan (TW)

(73) Assignee: Formosa Epitaxy Incorporation, Taoyuan County (TW)

( * ) Notice: Subject to any disclaimer, the term of this patent is extended or adjusted under 35 U.S.C. 154(b) by 538 days.

(21) Appl. No.: 12/905,258

(22) Filed: Oct. 15, 2010

(65) Prior Publication Data

US 2012/0045857 A1 Feb. 23, 2012

(30) Foreign Application Priority Data

Aug. 23, 2010 (TW) .............................. 99128153 A (51) Int. Cl.
*H01L 33/50* (2010.01)
(52) U.S. Cl.
USPC .......................................................... 438/26
(58) Field of Classification Search
USPC .................................... 438/22, 26, 106, 125;
257/E33.056–E33.059, E33.06
See application file for complete search history.

(56) References Cited

U.S. PATENT DOCUMENTS

| | | | | |
|---|---|---|---|---|
| 6,576,488 | B2* | 6/2003 | Collins et al. | 438/29 |
| 2006/0163589 | A1* | 7/2006 | Fan et al. | 257/88 |
| 2007/0145400 | A1* | 6/2007 | Sunohara et al. | 257/98 |
| 2008/0036362 | A1* | 2/2008 | Tanimoto et al. | 313/498 |
| 2008/0179611 | A1* | 7/2008 | Chitnis et al. | 257/98 |
| 2009/0014736 | A1* | 1/2009 | Ibbetson et al. | 257/98 |
| 2009/0057701 | A1* | 3/2009 | Chao | 257/98 |
| 2009/0212308 | A1* | 8/2009 | Brunner et al. | 257/98 |
| 2010/0187556 | A1* | 7/2010 | Kim et al. | 257/98 |
| 2010/0219433 | A1* | 9/2010 | Lin et al. | 257/98 |
| 2010/0252845 | A1* | 10/2010 | Lin et al. | 257/98 |

* cited by examiner

*Primary Examiner* — Michele Fan
(74) *Attorney, Agent, or Firm* — Rosenberg, Klein & Lee (57) ABSTRACT

A method for manufacturing light emitting device is provided. Firstly, provide a substrate. Then arrange a light emitting unit on the substrate. Next form at least one electrode and arrange at least one protective layer on the electrode. The protective layer is to prevent a phosphor layer following formed on the light emitting unit from covering the electrode. After forming the phosphor layer, flatten the phosphor layer and the protective layer. A part of the phosphor layer over the protective layer is removed. Thus the electrode is not affected by the phosphor layer and conductivity of the electrode is improved to resolve phosphor thickness and uniformity problems of the light emitting device. Therefore, the thickness of the light emitting device with LED is effectively reduced and stability of white color temperature control is significantly improved.

5 Claims, 9 Drawing Sheets

METHOD FOR MANUFACTURING LIGHT EMITTING DEVICE

BACKGROUND OF THE INVENTION

1. Fields of the invention

The present invention relates to a method for manufacturing light emitting devices.

2. Descriptions of Related Art

The first light emitting diode (LED) product was developed in 1968. Then LED of various colors have been invented in optoelectronic industries. In 1993, Japan Nichia Corporation demonstrated blue and green LEDs with higher luminous efficiency and this caused development of full-color LED products. The existence of GaInN based blue and green LEDs quickly led to the development of the first white light LED. Since mass production of white light LED by Nichia corporation in 1996, global LED manufacturers speed up the pace of mass production of white light LED. White light LEDs quickly matched and overtook the efficiency of standard incandescent lighting systems so that they nearly completely replace traditional incandescent lighting available now in virtually all applications. White light LEDs have become energy saving and environmental friendly lighting. Moreover, LED has features of high shock resistance, long life and less power consumption etc. Thus more and more outdoor lighting devices or displays such as traffic signs or outdoor electronic billboards use LED as light emitting elements. Furthermore, under the trends of energy saving and carbon reduction, LED has become mainstream of backlight of liquid crystal displays because LED meets the requirements of high brightness and low power consumption. LED not only comply with the requirements of environmental protection but also provides high-brightness illumination, especially white light LED which has more applications.

Traditional white light sources made from sold semiconductor are divided into three groups. The first white-light module composed of mixed red, blue and green LED chips has advantages of high luminous efficiency and high color rendering index. The LED chips with different colors are made from different epitaxial materials so that the voltage of the light module varies according to electrical properties of the chips. Thus the cost of the white light module is high, the design of the control circuit is quite complicated, and poor color mixing. The second group uses YAG phosphor powder to convert light from a blue LED to white light. This is the mainstream of white light LED manufacturing on the market. The technology features on coating a layer of optical adhesive mixed with YAG phosphor powder on a blue LED chip so that light from the blue LED emits into the optical adhesive and excites the YAG phosphor powder so as to obtain a light having a wavelength ranging from 400 to 530 nm. Part of blue light emitted from the blue LED chip is mixed with light excited from the phosphor powder to produce light that appears white. The third group LED is fabricated using both RGB (red, green and blue) phosphors and UV LEDs. The UV LEDs emit blue-violet color and phosphors in an optical adhesive are excited to produce white light with three wavelengths.

As to the packaging of white light LED, the heat dissipation problem has great influence on the lifetime while developing high power and large area LED lighting module. The LED is packaged by glue dispensing, encapsulation, molding, etc. Epoxy is the most common used material for packaging for economic concern. However, if the epoxy becomes sticky, the phosphor layer will have unavoidable defects such as bubbles, notches, dark spots and phosphor precipitation. Moreover, the phosphor layer is not a smooth and flat surface so that the colored light can't maintain the uniformity. Thus the white light LED products have color difference at different angles. Along with the improvement of phosphors or encapsulant materials, the luminous efficiency and light conversion efficiency of white light LED have been improved. Yet the white light LED still got many problems. For example, the thickness of the phosphor layer keeps increasing. Or external electrodes of the white light LED have been covered by phosphors or encapsulant materials and this leads to bad electrical contacts. Furthermore, the phosphor layer still have non-flat surface and the color uniformity issue is still a problem.

Thus there is a need to invent a method for manufacturing light emitting devices that not only improves electrode coverage but also reduce the thickness of the phosphor layers. Thus the thickness of lighting devices with LED is effectively reduced.

SUMMARY OF THE INVENTION

Therefore it is a primary object of the present invention to provide a method for manufacturing light emitting devices in which electrodes are not covered by phosphors so as to improve conductivity of the electrodes.

It is another object of the present invention to provide a method for manufacturing light emitting devices in which electrodes are protected by protective layers and the height of phosphor layers is not over the height of the protective layers. Thus the light emitting devices are with reduced thickness and better color uniformity.

In order to achieve above objects, a method for manufacturing light emitting devices according to the present invention includes following steps. Firstly, form at least one electrode that is electrically connected to the light emitting unit. Next form a plurality of protective layers on the electrode. Dispose a phosphor layer on the light emitting unit and the phosphor layer covers the light emitting unit and the protective layers. Later remove part of the phosphor layer over the protective layers, flatten the phosphor layer and remove the protective layers. During manufacturing processes of the light emitting device, the protective layer is used to avoid reduced conductivity of the electrode under the influence of the phosphor layer. Moreover, the present invention improves phosphor thickness and uniformity of the light emitting devices.

Therefore, the thickness of the LED light emitting device is effective reduced and stability of white color temperature control is significantly improved.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

Figure 1A:
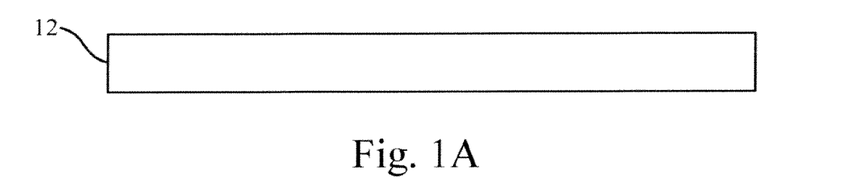
FIG. 1A is a schematic drawing showing a step of an embodiment according to the present invention.
Figure 1B:
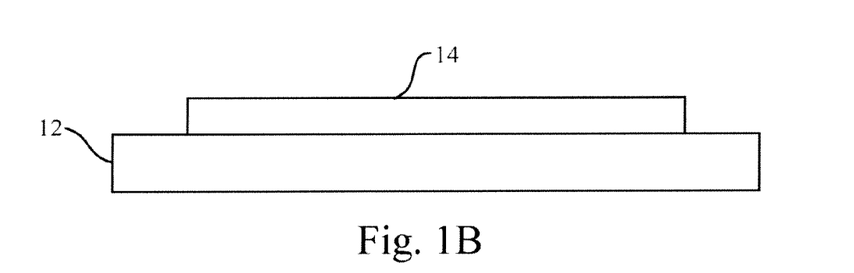
FIG. 1B is a schematic drawing showing a step of an embodiment according to the present invention.
Figure 1C:
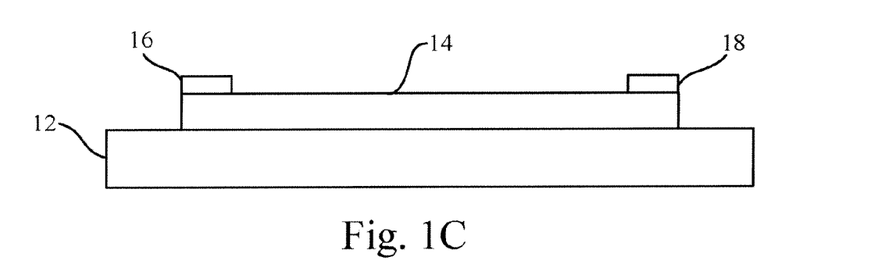
FIG. 1C is a schematic drawing showing a step of an embodiment according to the present invention.
Figure 1D:
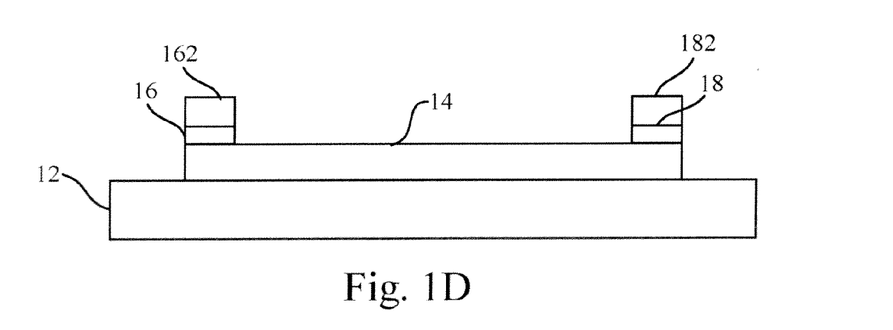
FIG. 1D is a schematic drawing showing a step of an embodiment according to the present invention.

Refer from FIG. 1A to FIG. 1G, a flow chart showing manufacturing processes of a light emitting device 10 of the present invention is revealed. As shown in FIG. 1A, provide a substrate 12 that is made from $Al_2O_3$, SiC, GaAs, GaN, AlN, GaP, Si, ZnO, MnO, III-V compounds, II-VI compounds, Group IV elements, IV-IV compounds or their combinations. Refer to FIG. 1B, form a light emitting unit 14 on the substrate 12. In this embodiment, the light emitting unit 14 is a front-emitting light emitting diode (LED) chip. Thus a first electrode 16 and a second electrode 18 are respectively formed on the light emitting unit 14 as shown in FIG. 1C. The first electrode 16 as well as the second electrode 18 is made from gold, silver, lead, indium, tin, conductive adhesive or their combinations. Refer to FIG. 1D, a first protective layer 162 and a second protective layer 182 are respectively arranged over the first electrode 16 and the second electrode 18. The first protective layer 162 and the second protective layer 182 are made from dielectric materials, organic materials or curing materials.

Figure 1E:
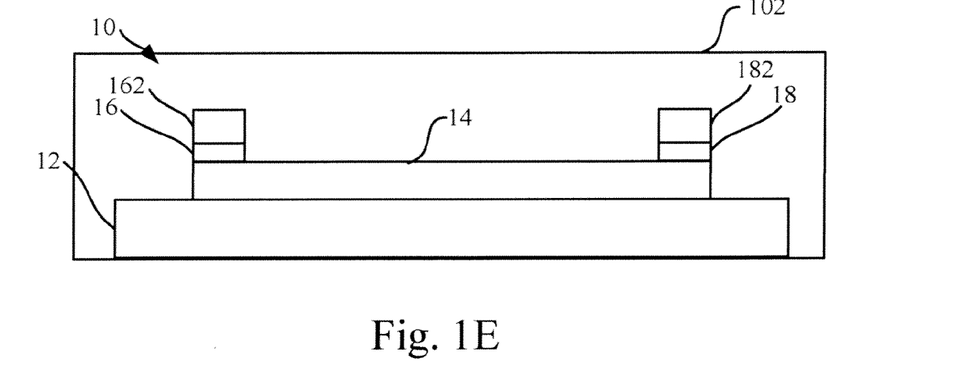
FIG. 1E is a schematic drawing showing a step of an embodiment according to the present invention.
Figure 1F:
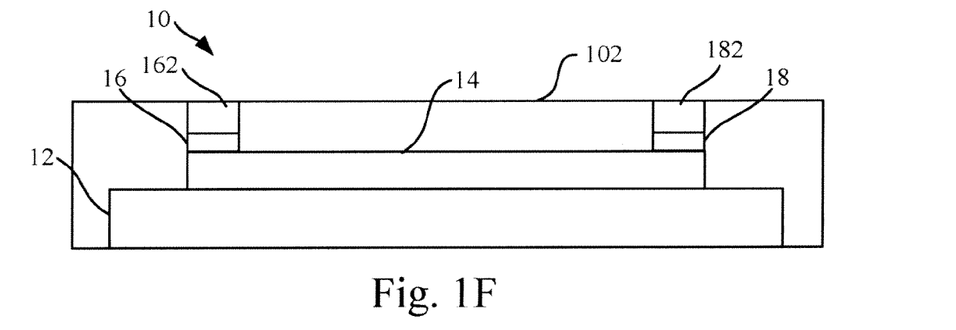
FIG. 1F is a schematic drawing showing a step of an embodiment according to the present invention.
Figure 1G:
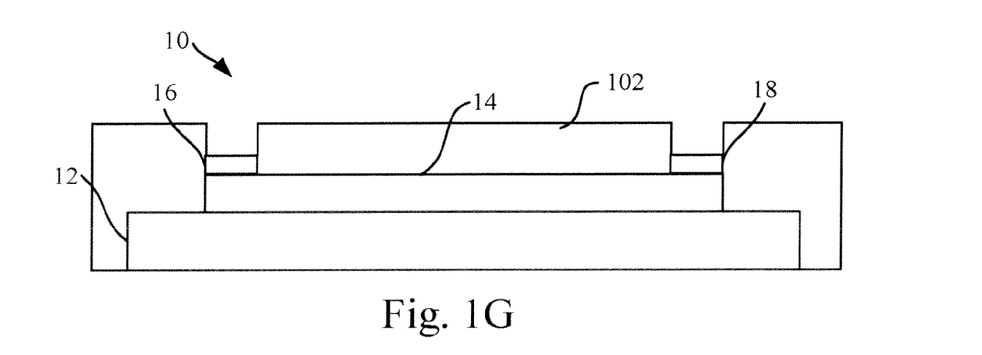
FIG. 1G is a schematic drawing showing a step of an embodiment according to the present invention.

As shown in FIG. 1E, arrange a phosphor layer 102 over the light emitting unit 14. The phosphor layer 102 is made from following materials: YAG (Yttrium Aluminum Garnet), Terbium Aluminum Garnet (TAG), silicate such as compositions having crystal phase of $Sr_2SiO_4$ or $Sr_3SiO_5$, sulfate, nitrate or their combinations. Moreover, the phosphor layer 102 can be made from transparent resin, silicon or their combinations. The transparent resin is epoxy resin, polyethylene or polypropylene, etc. Refer to FIG. 1F, remove the phosphor layer 102 over the first protective layer 162 and the second protective layer 182 by machining or abrasive cutting. That means part of the phosphor layer 102 whose height is higher than that of the first protective layer 162 and the second protective layer 182 is removed. The machining is done by waterjets or machinery cutters while the abrasive cutting is run by grinding wheels. Thus the thickness of the phosphor layer 102 is no more than that of the first protective layer 162 and the second protective layer 182. The thickness of the phosphor layer 102 ranges from 10 micrometers to 50 micrometers. Refer to FIG. 1G, the first protective layer 162 and the second protective layer 182 are removed by etching. The etching can be wet etching or dry etching. In this embodiment, after removing, the first electrode 16 and the second electrode 18 will not be covered by the phosphor layer 102 so that the conductivity of the first electrode 16 and of the second electrode 18 is not reduced. And bad contact due to the effect of the phosphor layer 102 on the first electrode 16 and the second electrode 18 can also be avoided. Moreover, a light emission surface of the phosphor layer 102 after being modified is a smooth and flat surface. Thus the light emitting device 10 of the present invention has better color uniformity and the thickness of the phosphor is optimized. Therefore, the thickness of the LED light emitting device is effectively reduced. At the same time, stability of white color temperature control is significantly improved.

Figure 2A:
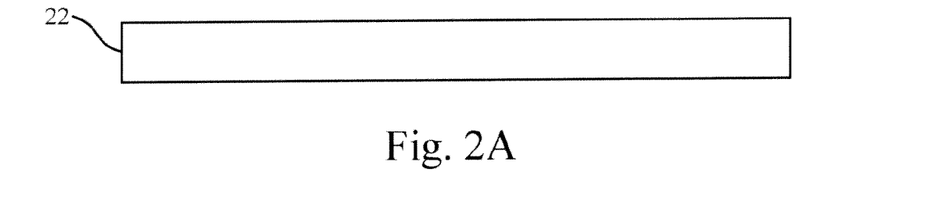
FIG. 2A is a schematic drawing showing a step of another embodiment according to the present invention.
Figure 2B:
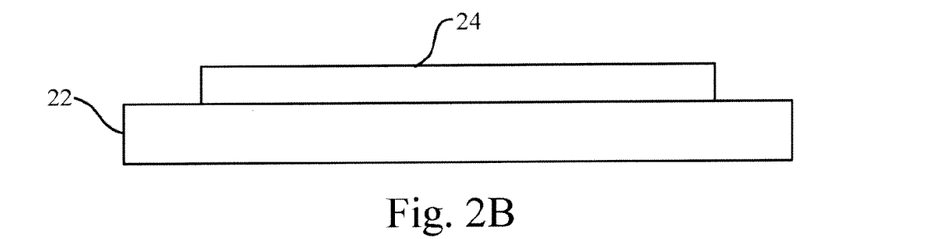
FIG. 2B is a schematic drawing showing a step of another embodiment according to the present invention.
Figure 2C:
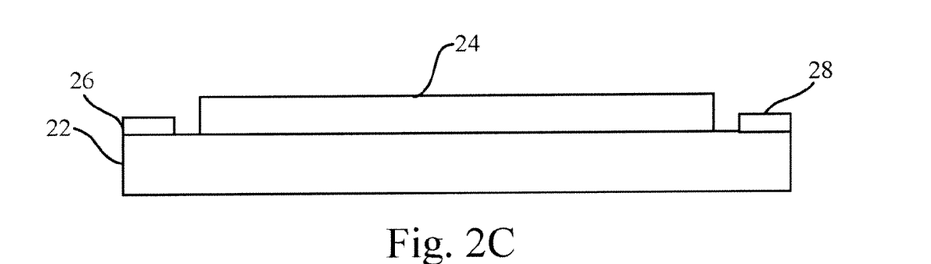
FIG. 2C is a schematic drawing showing a step of another embodiment according to the present invention.
Figure 2D:
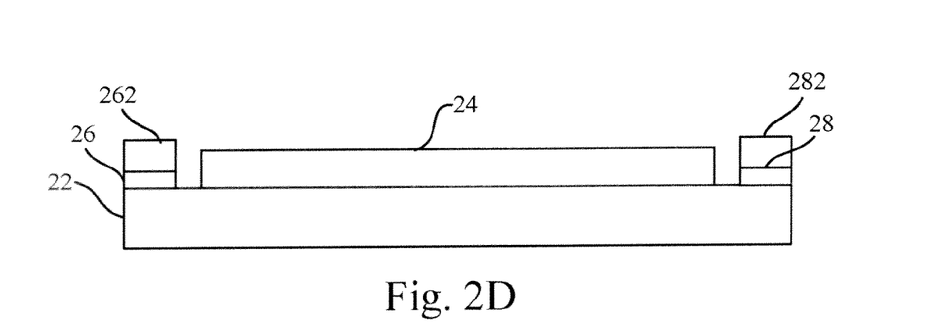
FIG. 2D is a schematic drawing showing a step of another embodiment according to the present invention.

Refer from FIG. 2A to FIG. 2G, a flow chart of another embodiment according to the present invention is revealed. The flow chart of manufacturing a second light emitting device 20 includes a plurality of steps. As shown in FIG. 2A, provide a conductive substrate 22. The substrate 22 is made from semiconductors, metals or alloys. As shown in FIG. 2B, form a light emitting unit 24 on the substrate 22. In this embodiment, the light emitting unit 14 is a flip-chip light emitting diode (LED) chip. As shown in FIG. 2C, a first electrode 26 and a second electrode 28 are respectively formed on the substrate 22 and are respectively electrically connected to the light emitting unit 24. The first electrode 26 as well as the second electrode 28 is made from gold, silver, lead, indium, tin, conductive adhesive or their combinations. Refer to FIG. 2D, a first protective layer 262 and a second protective layer 282 are respectively formed over the first electrode 26 and the second electrode 28. The first protective layer 262 and the second protective layer 282 are made from dielectric materials, organic materials or curing materials.

Figure 2E:
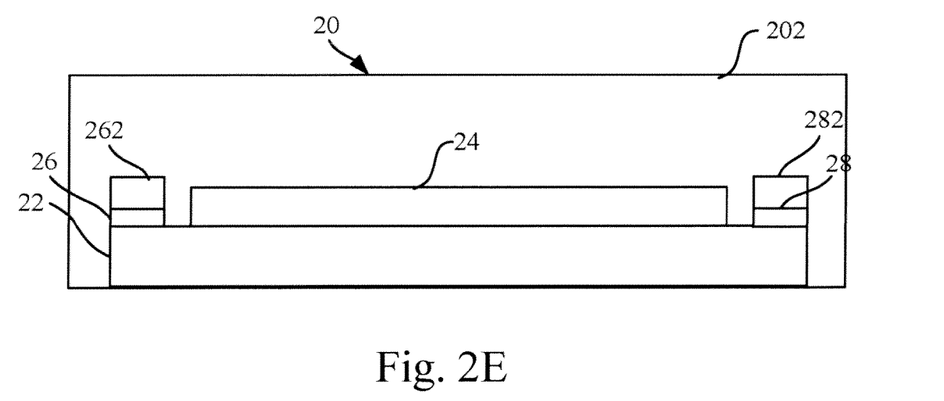
FIG. 2E is a schematic drawing showing a step of another embodiment according to the present invention.
Figure 2F:
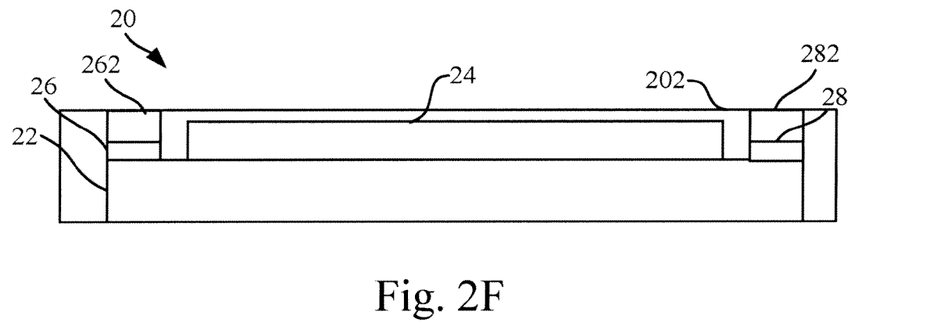
FIG. 2F is a schematic drawing showing a step of another embodiment according to the present invention.
Figure 2G:
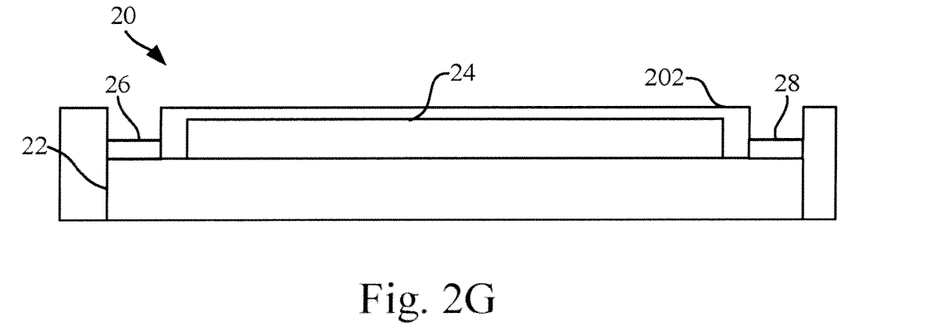
FIG. 2G is a schematic drawing showing a step of another embodiment according to the present invention.

As shown in FIG. 2E, arrange a phosphor layer 202 over the light emitting unit 14. The phosphor layer 202 is made from following materials: YAG (Yttrium Aluminum Garnet), Terbium Aluminum Garnet (TAG), silicate such as compositions having crystal phase of $Sr_2SiO_4$ or $Sr_3SiO_5$, sulfate, nitrate or their combinations. Moreover, the phosphor layer 202 can be made from transparent resin, silicon or their combinations. The transparent resin is epoxy resin, polyethylene or polypropylene, etc. Refer to FIG. 2F, make the phosphor layer 202, the first protective layer 262 and the second protective layer 282 flat by machining or abrasive cutting so that the thickness of the phosphor layer 202 is no more than that of the first protective layer 262 and the second protective layer 282. The machining is done by waterjets or machinery cutters while the abrasive cutting is run by grinding wheels. Thus the thickness of the phosphor layer 202 is equal or smaller than that of the first protective layer 262 and the second protective layer 282. The thickness of the phosphor layer 202 is ranging from 10 micrometers to 50 micrometers. As shown in FIG. 2G, the first protective layer 262 and the second protective layer 282 are removed by wet etching or dry etching. After removing, the first electrode 26 and the second electrode 28 will not be covered by the phosphor layer 202 so that the conductivity of the first electrode 26 and of the second electrode 28 is not reduced. Moreover, under the influence of the phosphor layer 202, the first electrode 26 and the second electrode 28 may have bad contact problems and the light emitting device 20 becomes defective item. Furthermore, a light emission surface of the phosphor layer 202 after being modified is a smooth and flat surface. Thus the light emitting device 20 of the present invention has better color uniformity and the thickness of the phosphor is optimized. Therefore, the thickness of the LED light emitting device is effectively reduced. At the same time, stability of white color temperature control is significantly improved.

Figure 3A:
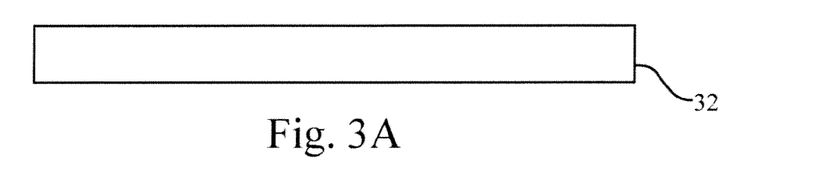
FIG. 3A is a schematic drawing showing a step of a further embodiment according to the present invention.
Figure 3B:
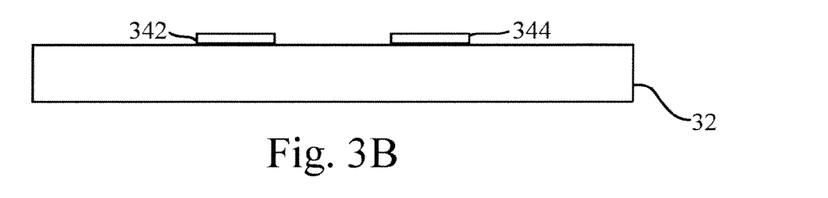
FIG. 3B is a schematic drawing showing a step of a further embodiment according to the present invention.
Figure 3C:
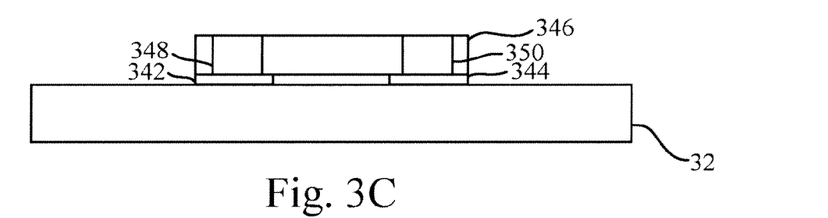
FIG. 3C is a schematic drawing showing a step of a further embodiment according to the present invention.

Refer from FIG. 3A to FIG. 3G, a flow chart of a further embodiment showing manufacturing processes of a third light emitting device 30 according to the present invention is revealed. As shown in FIG. 3A, provide a substrate 32 that is made from Al$_2$O$_3$, SiC, GaAs, GaN, AlN, GaP, Si, ZnO, MnO, III-V compounds, II-VI compounds, Group IV elements, IV-IV compounds or their combinations. Refer to FIG. 3B, arrange a first conductive film 342 as well as a second conductive film 344 of a light emitting module 34 (shown in FIG. 3E) at the substrate 32. The first conductive film 342 as well as the second conductive film 344 is made from gold, silver, lead, indium, tin, conductive adhesive or their combinations. Refer to FIG. 3C, dispose a sub-mount 346 over the first conductive film 342 and the second conductive film 344. The sub-mount 346 includes a first connecting unit 348 and a second connecting unit 350 respectively electrically connected to the first conductive film 342 and the second conductive film 344. The sub-mount 346 is made from Al$_2$O$_3$, SiC, GaAs, GaN, AlN, GaP, Si, ZnO, MnO, III-V compounds, II-VI compounds, Group N elements, IV-IV compounds or their combinations.

Figure 3D:
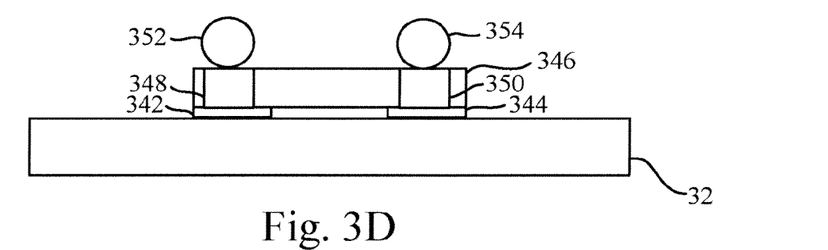
FIG. 3D is a schematic drawing showing a step of a further embodiment according to the present invention.
Figure 3E:
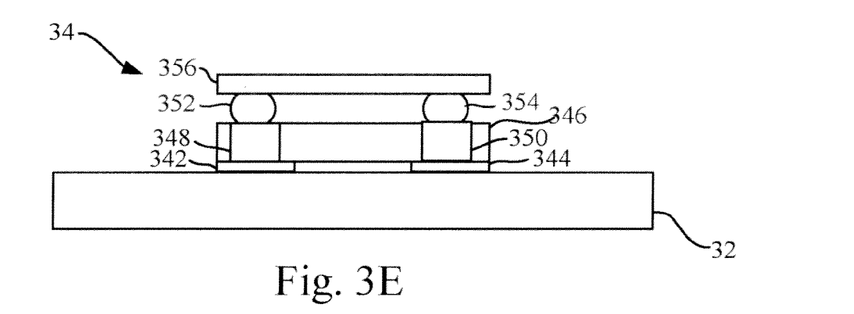
FIG. 3E is a schematic drawing showing a step of a further embodiment according to the present invention.

Refer to FIG. 3D, form a first conductive support part 352 and a second conductive support part 354 on the sub-mount 346 while the first conductive support part 352 is electrically connected to the first connecting unit 348 and the second conductive support part 354 is electrically connected to the second connecting unit 350. The first conductive support part 352 and the second conductive support part 354 are made from gold, silver, lead, indium, tin, conductive adhesive or their combinations. Refer to FIG. 3E, arranged a light emitting unit 356 over both the first conductive support part 352 and the second conductive support part 354. The light emitting unit 356 is electrically connected to the first conductive support part 352 and the second conductive support part 354. The light emitting unit 356 is arranged with at least one LED and the LED can be a vertical-emitting LED, a flip-chip LED or a front-emitting LED.

Figure 3F:
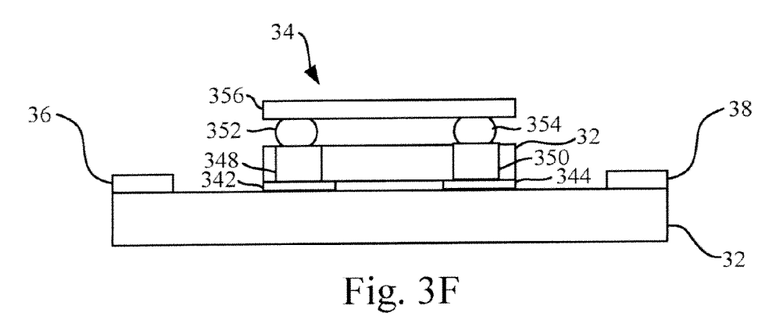
FIG. 3F is a schematic drawing showing a step of a further embodiment according to the present invention.
Figure 3G:
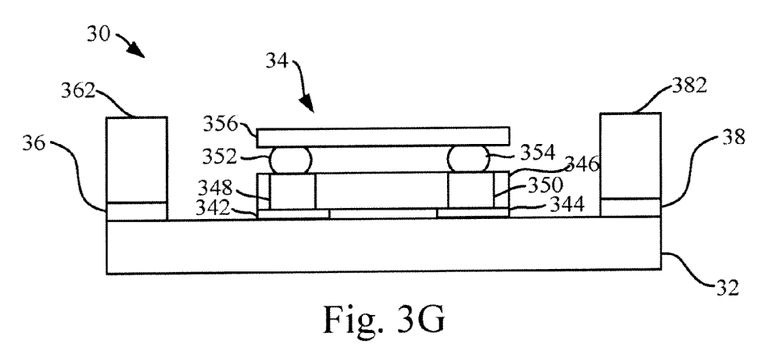
FIG. 3G is a schematic drawing showing a step of a further embodiment according to the present invention.
Figure 3H:
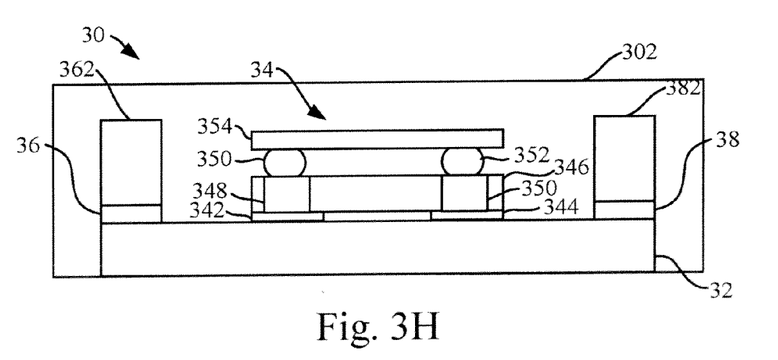
FIG. 3H is a schematic drawing showing a step of a further embodiment according to the present invention.

Refer to FIG. 3F, arranged a first electrode 36 and a second electrode 38 on the substrate 32, respectively located on each of two sides of the light emitting module 34. The first electrode 36 is electrically connected to the first conductive film 342 and the second electrode 38 is electrically connected to the second conductive film 344. The first electrode 36 and the second electrode 38 are made from gold, silver, lead, indium, tin, conductive adhesive or their combinations. As shown in FIG. 3G, a first protective layer 362 and a second protective layer 382 are respectively arranged on the first electrode 36 and the second electrode 38. The first protective layer 362 and the second protective layer 382 are made from dielectric materials, organic materials or curing materials. Refer to FIG. 3H, form a phosphor layer 302 on the light emitting module 34. Materials for the phosphor layer 302 are selected from followings: YAG (Yttrium Aluminum Garnet), Terbium Aluminum Garnet (TAG), silicate such as compositions having crystal phase of Sr2SiO4 or Sr3SiO5, sulfate, nitrate or their combinations. Moreover, the phosphor layer 302 can be made from transparent resin, silicon or their combinations. The transparent resin is epoxy resin, polyethylene or polypropylene, etc.

Figure 3I:
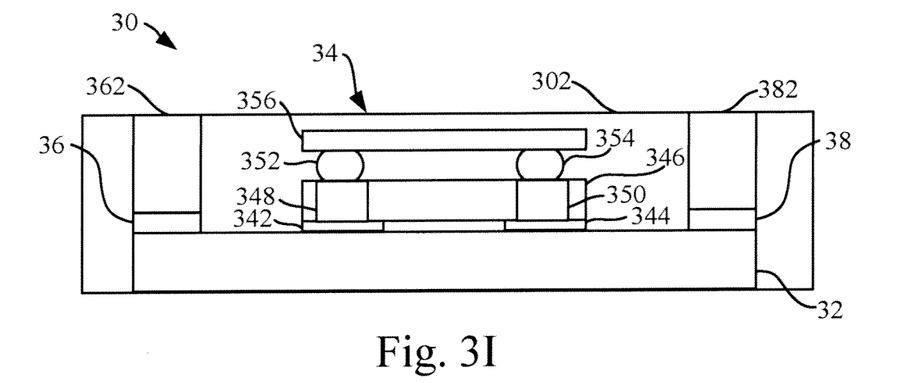
FIG. 3I is a schematic drawing showing a step of a further embodiment according to the present invention.
Figure 3J:
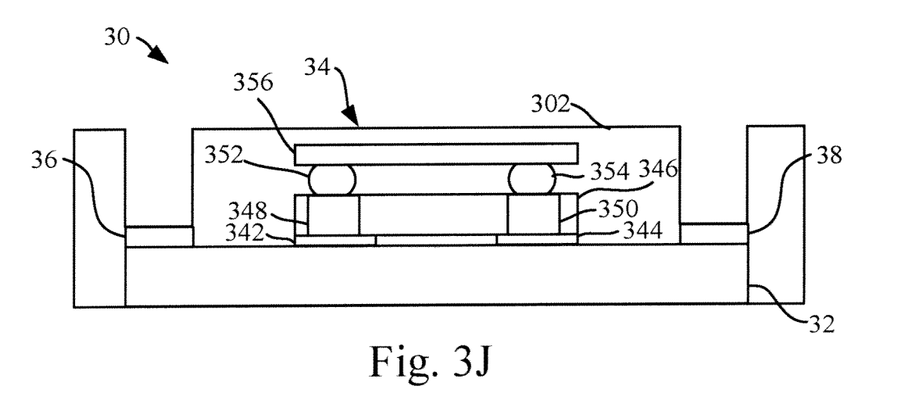
FIG. 3J is a schematic drawing showing a step of a further embodiment according to the present invention.

Refer to FIG. 3I, remove part of the phosphor layer 302 over the first protective layer 362 and the second protective layer 382 by machining or abrasive cutting. That means part of the phosphor layer 302 whose height is higher than that of the first protective layer 362 and the second protective layer 382 needs to be removed so that the thickness of the phosphor layer 302 is no more than that of the first protective layer 362 and the second protective layer 382 and the light emission surface of the phosphor layer 302 has become more flat and smooth. The machining is done by waterjets or machinery cutters while the abrasive cutting is run by grinding wheels. Thus the thickness of the phosphor layer 302 is no equal or smaller than that of the first protective layer 362 and the second protective layer 382. The thickness of the phosphor layer 302 ranges from 10 micrometers to 50 micrometers. Refer to FIG. 3J, the first protective layer 362 and the second protective layer 382 are removed by etching. The etching can be wet etching or dry etching. In this embodiment, after removing the protective layers 362, 382, the first electrode 36 and the second electrode 38 will not be covered by the phosphor layer 302 so that the conductivity of the first electrode 36 and of the second electrode 38 is not reduced. Moreover, under the influence of the phosphor layer 302, the first electrode 36 and the second electrode 38 may have bad contact problems and the light emitting device 30 becomes defective item. These problems can be prevented. Furthermore, a light emission surface of the phosphor layer 302 becomes a smooth and flat surface after being modified. Thus the light emitting device 30 of the present invention has better color uniformity and the thickness of the phosphor is optimized. Therefore, the thickness of the LED light emitting device is effectively reduced. At the same time, stability of white color temperature control is significantly improved.

Figure 4A:
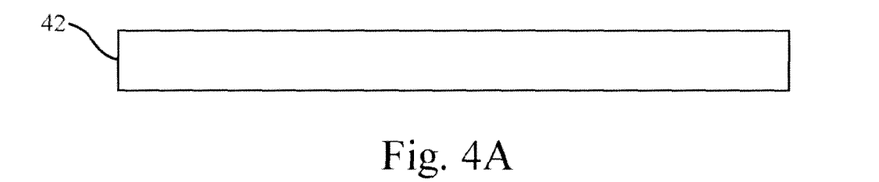
FIG. 4A is a schematic drawing showing a step of a further embodiment according to the present invention.
Figure 4B:
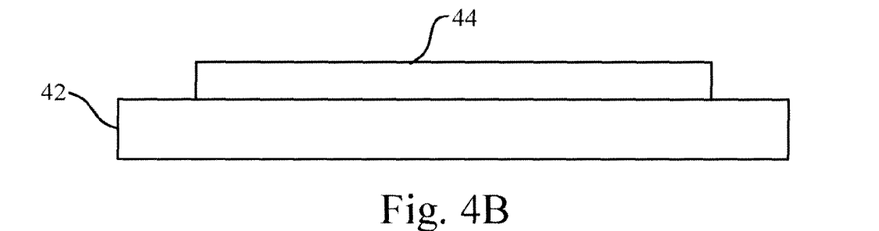
FIG. 4B is a schematic drawing showing a step of a further embodiment according to the present invention.
Figure 4C:
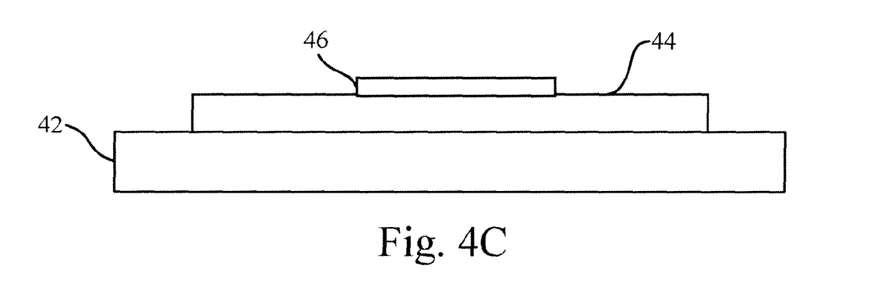
FIG. 4C is a schematic drawing showing a step of a further embodiment according to the present invention.
Figure 4D:
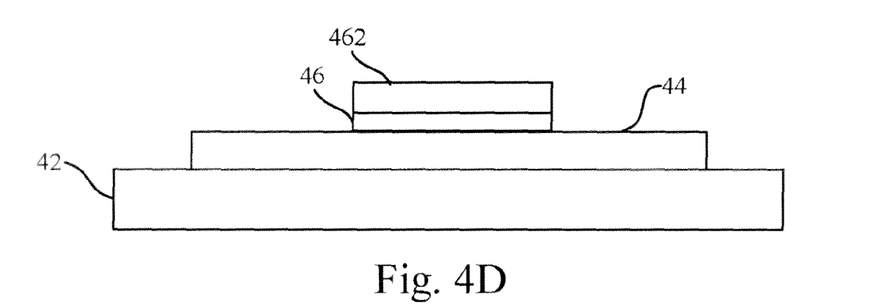
FIG. 4D is a schematic drawing showing a step of a further embodiment according to the present invention.

Refer from FIG. 4A to FIG. 4G, a flow chart of a further embodiment showing manufacturing processes of a fourth light emitting device 40 according to the present invention is revealed. As shown in figure, the method of the present invention is applied to manufacturing of vertical-emitting LED. Refer to FIG. 4A, provide a conductive substrate 42 that is made from semiconductors, metals or alloys. Refer to FIG. 4B, arranged a light emitting unit 44 on the substrate 42. In this embodiment, the light emitting unit 44 is a vertical-lighting LED. As shown in FIG. 4C, an upper electrode 46 is formed on the light emitting unit 44 and is electrically connected to the light emitting unit 44. The upper electrode 46 is made from gold, silver, lead, indium, tin, conductive adhesive or their combinations. Refer to Fig, 4D, a protective layer 462 is disposed over the upper electrode 46. The protective layer 462 is made from dielectric materials, organic materials or curing materials.

Figure 4E:
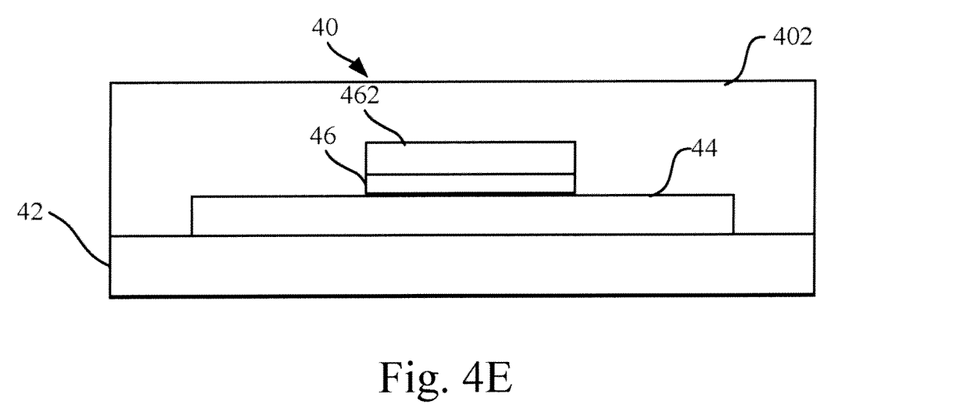
FIG. 4E is a schematic drawing showing a step of a further embodiment according to the present invention.
Figure 4F:
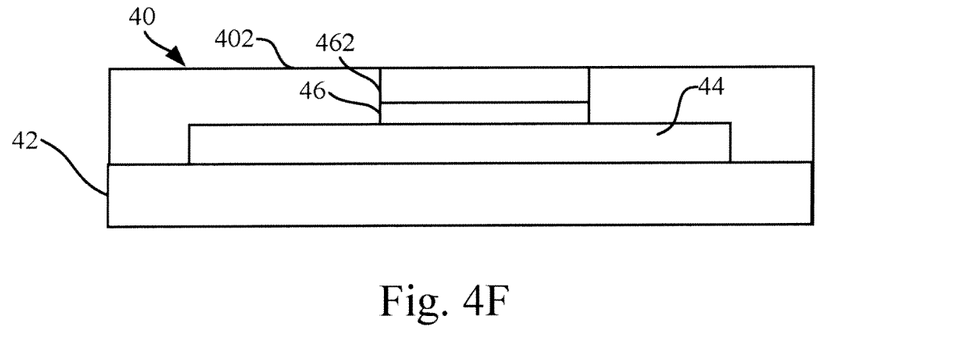
FIG. 4F is a schematic drawing showing a step of a further embodiment according to the present invention.
Figure 4G:
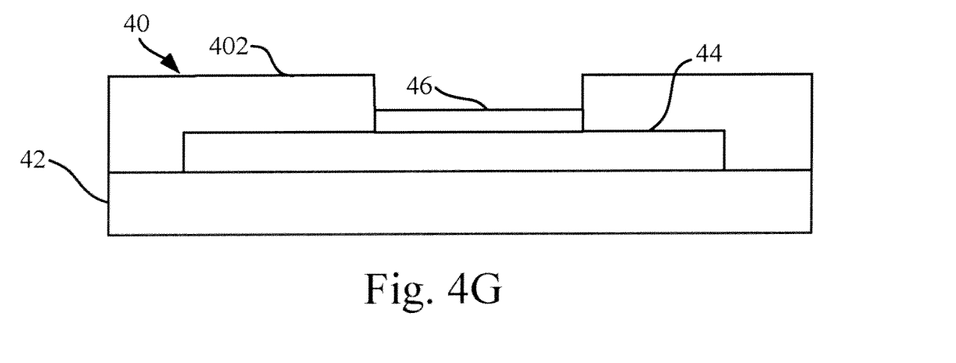
FIG. 4G is a schematic drawing showing a step of a further embodiment according to the present invention.

Refer to FIG. 4E, dispose a phosphor layer 402 over the light emitting unit 44. Materials for the phosphor layer 402 are selected from followings: YAG (Yttrium Aluminum Garnet), Terbium Aluminum Garnet (TAG), silicate such as compositions having crystal phase of $Sr_2SiO_4$ or $Sr_3SiO_5$, sulfate, nitrate or their combinations. Moreover, the phosphor layer 402 can be made from transparent resin, silicon or their combinations. The transparent resin is epoxy resin, polyethylene or polypropylene, etc. As shown in FIG. 4F, flatten the phosphor layer 402, and the protective layer 462 by machining or abrasive cutting so that the thickness of the phosphor layer 402 is no more than that of the protective layer 462. The machining is done by waterjets or machinery cutters while the abrasive cutting is run by grinding wheels. Thus the thickness of the phosphor layer 402 is equal or smaller than that of the protective layer 462. The thickness of the phosphor layer 402 ranges from 10 micrometers to 50 micrometers. Refer to FIG. 4G, the protective layer 462 is removed by etching. The etching can be wet etching or dry etching. In this embodiment, the upper electrode 46 will not be covered by the phosphor layer 402 so that the conductivity of the upper electrode 46 is not reduced. Thus the bad contact problem of the upper electrode 46 or defective item problem due to the influence of the phosphor layer 402 can also be prevented. Moreover, a light emission surface of the phosphor layer 402 is flattened to form a smooth and flat surface. Thus the light emitting device 40 of the present invention has better color uniformity and the thickness of the phosphor is optimized. Therefore, the thickness of the LED light emitting device is effectively reduced. At the same time, stability of white color temperature control is significantly improved.

In summary, a method for manufacturing light emitting devices of the present invention uses protective layers to prevent electrodes on the substrate from being covered by phosphor layers and further avoid reduced conductivity of the electrodes under influence of the phosphor layers. The light emitting devices produced by the present method will not become defective due to bad contact of the electrodes while connecting to external power sources. Moreover, light emitting devices of the present invention are with reduced thickness and better color uniformity.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A method for manufacturing light emitting devices comprising the steps of:
   providing a substrate;
   providing and arranging a light emitting module on the substrate, said light emitting module having a light emitting unit and a sub-mount;
   forming a first electrode and a second electrode, both of which are electrically connected to the light emitting unit by the sub-mount;
   forming a first protective layer and a second protective layer with the first protective layer located over the first electrode and the second protective layer located over at the second electrode;
   disposing a phosphor layer on the light emitting module with the phosphor layer covering both the light emitting module and the first and second protective layers;
   removing part of the phosphor layer over the first and second protective layers; and
   removing the first and second protective layers.

2. The method as claimed in claim 1, wherein the step of providing and arranging a light emitting module on the substrate further includes the steps of:
   forming a first conductive film and a second conductive film;
   providing and arranging a sub-mount over the first conductive film and the second conductive film with the sub-mount having at least one first connecting unit and at least one second connecting unit; the first connecting unit electrically connected to the first conductive film and the second connecting unit electrically connected to the second conductive film; and
   arranging the light emitting unit on the sub-mount with the light emitting unit electrically connected to both the first connecting unit and the second connecting unit so as to form the light emitting module;
   wherein the first conductive film and the second conductive film are electrically connected to the first electrode and the second electrode, respectively.

3. The method as claimed in claim 1, wherein in the step of removing part of the phosphor layer over the first and second protective layers, the phosphor layer is removed by abrasive cutting or machining so that the height of the phosphor layer is no more than the height of the first and second protective layers.

4. The method as claimed in claim 1, wherein in the step of removing the first and second protective layers, the first and second protective layers are removed by etching.

5. The method as claimed in claim 1, wherein a thickness of the phosphor layer ranges from 10 micrometers to 50 micrometers.

* * * * *